(12) United States Patent
Li et al.

(10) Patent No.: US 12,221,374 B2
(45) Date of Patent: Feb. 11, 2025

(54) ADDITIVE MANUFACTURING PROCESSES AND MANUFACTURED ARTICLE

(71) Applicant: CORNING INCORPORATED, Corning, NY (US)

(72) Inventors: Xinghua Li, Horseheads, NY (US); Richard Curwood Peterson, Elmira Heights, NY (US); Christopher Clark Thompson, Corning, NY (US); Ezra Morgan Yarnell, Corning, NY (US)

(73) Assignee: CORNING INCORPORATED, Corning, NY (US)

( * ) Notice: Subject to any disclaimer, the term of this patent is extended or adjusted under 35 U.S.C. 154(b) by 661 days.

(21) Appl. No.: 17/336,905

(22) Filed: Jun. 2, 2021

(65) Prior Publication Data
US 2021/0292216 A1 Sep. 23, 2021

Related U.S. Application Data

(62) Division of application No. 15/751,693, filed as application No. PCT/US2016/046723 on Aug. 12, 2016, now Pat. No. 11,053,154.
(Continued)

(51) Int. Cl.
*B32B 15/04* (2006.01)
*B32B 3/26* (2006.01)
(Continued)

(52) U.S. Cl.
CPC .......... *C03B 19/1453* (2013.01); *B32B 3/266* (2013.01); *B32B 17/06* (2013.01);
(Continued)

(58) Field of Classification Search
CPC ................. B32B 3/266; B32B 17/06
(Continued)

(56) References Cited

U.S. PATENT DOCUMENTS

| 2,515,936 A | 7/1950 | Armistead, Jr. |
| 3,208,860 A | 9/1965 | Armistead et al. |

(Continued)

FOREIGN PATENT DOCUMENTS

| CN | 102471124 A | 5/2012 |
| CN | 103213281 A | 7/2013 |

(Continued)

OTHER PUBLICATIONS

Cheng et al; "Integrating 3D Photonics and Microfluidics Using Ultrashort Laser Pulses"; SPIE Newsroom, 2006.
(Continued)

*Primary Examiner* — Lauren R Colgan
(74) *Attorney, Agent, or Firm* — Daniel J. Greenhalgh

(57) ABSTRACT

An additive manufacturing process includes forming an object material stack using sheet materials without use of binder material between the sheet materials and forming features of the cross-sectional layers of a 3D object in the corresponding sheet materials. Another process involves forming features of the cross-sectional layers of a 3D object in soot layers of a laminated soot sheet. A manufactured article includes three or more glass layers laminated together without any binder material between the glass layers. At least one of the glass layers is composed of silica or doped silica, and at least one feature is formed in at least one of the glass layers.

15 Claims, 9 Drawing Sheets

Related U.S. Application Data

(60) Provisional application No. 62/204,627, filed on Aug. 13, 2015.

(51) Int. Cl.
| | |
|---|---|
| *B32B 17/06* | (2006.01) |
| *B33Y 70/00* | (2020.01) |
| *B81C 99/00* | (2010.01) |
| *C03B 17/02* | (2006.01) |
| *C03B 19/14* | (2006.01) |
| *C03B 23/203* | (2006.01) |
| *C03B 23/24* | (2006.01) |
| *C03C 23/00* | (2006.01) |
| *B33Y 10/00* | (2015.01) |

(52) U.S. Cl.
CPC .......... *B33Y 70/00* (2014.12); *B81C 99/0025* (2013.01); *C03B 17/02* (2013.01); *C03B 19/1492* (2013.01); *C03B 23/203* (2013.01); *C03B 23/245* (2013.01); *C03C 23/0025* (2013.01); *B32B 2307/418* (2013.01); *B33Y 10/00* (2014.12); *B81B 2201/051* (2013.01)

(58) Field of Classification Search
USPC .......................................................... 428/426
See application file for complete search history.

(56) References Cited

U.S. PATENT DOCUMENTS

| | | | | |
|---|---|---|---|---|
| 4,169,001 A | * | 9/1979 | Kaiser | G02B 6/43 |
| | | | | 428/137 |
| 4,489,570 A | * | 12/1984 | Little | F25B 9/02 |
| | | | | 29/890.035 |
| 4,833,000 A | * | 5/1989 | Trickett | C04B 35/505 |
| | | | | 428/137 |
| 5,316,564 A | | 5/1994 | Nakamura et al. | |
| 5,635,301 A | * | 6/1997 | Kondo | H05K 1/0306 |
| | | | | 428/209 |
| 6,592,696 B1 | | 7/2003 | Burdon et al. | |
| 6,596,224 B1 | | 7/2003 | Sachs et al. | |
| 7,677,058 B2 | * | 3/2010 | Hawtof | C03B 19/1492 |
| | | | | 65/144 |
| 8,062,733 B2 | | 11/2011 | Hawtof et al. | |
| 8,181,485 B2 | | 5/2012 | Coffey et al. | |
| 8,359,884 B2 | * | 1/2013 | Hawtof | C03B 19/1492 |
| | | | | 65/144 |
| 8,438,876 B2 | * | 5/2013 | Noni, Jr. | C03B 19/1492 |
| | | | | 65/421 |
| 9,321,669 B2 | * | 4/2016 | Hawtof | C03B 19/1492 |
| 2002/0001682 A1 | | 1/2002 | Baker-Salmon | |
| 2002/0022261 A1 | | 2/2002 | Anderson et al. | |
| 2004/0007019 A1 | * | 1/2004 | Kohli | C03B 35/246 |
| | | | | 65/144 |
| 2004/0099712 A1 | | 5/2004 | Tonkovich et al. | |
| 2008/0007830 A1 | * | 1/2008 | Borrelli | G02B 5/3025 |
| | | | | 65/435 |
| 2008/0209945 A1 | | 9/2008 | Blevins | |
| 2008/0280057 A1 | | 11/2008 | Hawtof et al. | |
| 2009/0114293 A1 | * | 5/2009 | Kanai | G01N 21/05 |
| | | | | 156/60 |
| 2011/0014445 A1 | * | 1/2011 | Hawtof | C03B 19/1492 |
| | | | | 65/60.6 |
| 2013/0063955 A1 | * | 3/2013 | Rinko | B29D 11/0073 |
| | | | | 156/60 |
| 2013/0330246 A1 | | 12/2013 | Stemmet | |
| 2014/0138724 A1 | * | 5/2014 | Hitomi | H01L 33/60 |
| | | | | 65/36 |
| 2014/0141168 A1 | | 5/2014 | Rodgers | |
| 2015/0111007 A1 | * | 4/2015 | Hawtof | C03B 19/06 |
| | | | | 65/17.6 |
| 2016/0145137 A1 | | 5/2016 | Eva | |
| 2017/0050881 A1 | | 2/2017 | Abdolvand | |
| 2017/0240454 A1 | * | 8/2017 | Butler | C03B 23/037 |

FOREIGN PATENT DOCUMENTS

| | | |
|---|---|---|
| CN | 104401002 A | 3/2015 |
| CN | 104662274 A | 5/2015 |
| EP | 1645329 A2 | 4/2006 |
| EP | 2289845 A1 | 3/2011 |
| JP | 2001-247321 A | 9/2001 |
| JP | 2003-238178 A | 8/2003 |
| JP | 2007-145641 A | 6/2007 |
| JP | 2009-543129 A | 12/2009 |
| JP | 2010-526748 A | 8/2010 |
| JP | 2012-533506 A | 12/2012 |
| JP | 5182223 B2 | 4/2013 |
| WO | 98/56566 A1 | 12/1998 |
| WO | 2008/005488 A2 | 1/2008 |
| WO | 2008/025998 A2 | 3/2008 |
| WO | 2011/008911 A1 | 1/2011 |
| WO | 2014/201318 A1 | 12/2014 |
| WO | 2014/201320 A1 | 12/2014 |

OTHER PUBLICATIONS

English Translation of CN201680048319.9 Office Action Dated May 6, 2020; 7 Pages; Chinese Patent Office.
International Search Report and Written Opinion of the International Searching Authority; PCT/US2016/046723; Mailed Oct. 21, 2016; 12 Pages; European Patent Office.
Japanese Patent Application No. 2018-506921 Notice of Reasons for Refusal dated Sep. 16, 2020; 13 Pages; (6 pages of English Translation and 7 pages of Original Document) Japanese Patent Office.

* cited by examiner

ADDITIVE MANUFACTURING PROCESSES AND MANUFACTURED ARTICLE

This is a divisional application of U.S. application Ser. No. 15/751,693 filed Feb. 9, 2018, which claims the benefit of priority under 35 U.S.C. § 365 of International Application No. PCT/US2016/046723 filed on Aug. 12, 2016 which in turn claims the benefit of priority under 35 U.S.C. § 119 of U.S. Provisional Application Ser. No. 62/204,627 filed on Aug. 13, 2015, the disclosures of each of which are relied upon and incorporated herein by reference in their entirety.

BACKGROUND

Flat glass can be formed into a three-dimensional (3D) glass article using processes such as molding and pressing. However, forming complex 3D glass articles with internal features, i.e., features that are wholly contained within the article, such as internal channels and the like, using these methods is near impossible. Holes and the like can be machined in glass blocks. However, it is also difficult to form complex internal features, such as convoluted channels, in glass blocks using conventional machining techniques.

Additive manufacturing (AM), popularly referred to as 3D Printing, allows 3D objects to be built directly from a computer-aided design (CAD) model of the object. The 3D object is built layer by layer from a raw material, which would allow features to be built into each layer and contained within the object as internal features if so desired. However, very few of the available AM technologies indicate glass as a suitable raw material and virtually none claim the ability to produce transparent 3D glass.

For background purposes, the Table below lists the seven categories of AM processes identified by ASTM International (ASTM F2792-12a), examples of technologies that belong to each category, and raw materials used in each category. (See, ASTM F2792-12a, Standard Terminology for Additive Manufacturing Technologies, ASTM International, West Conshohocken, Pa., 2012, www.astm.org, and "The 7 Categories of Additive Manufacturing." Additive Manufacturing Research Group. Loughborough University, n.d. Web. 31 May 2015, www.lboro.ac.uk/research/amrg/about/the7categoriesofadditivemanufacturing).

TABLE

| AM Process Categories | Technologies | Raw Materials |
|---|---|---|
| Binder jetting | 3DP ™ (Three Dimensional Printing); Plaster-based 3D printing | Metals, polymers, ceramics, glass |
| Directed Energy Deposition | Laser engineered net shaping; directed light fabrication; direct metal deposition; 3D laser cladding | Metals and alloys |
| Material extrusion | FDM ® (fused deposition modeling) by Stratasys, Inc. | Polymers |
| Material jetting | MJM (Multi-jet modeling) by 3D Systems, Inc. | Polymers |
| Powder bed fusion | SLS ® (selective laser sintering) machines by 3D Systems Corporation; SHS ™ (selective heat sintering) by BluePrinter; DMLS ® (direct metal laser sintering) machines by EOS GmbH; EBM (Electron beam machining) | Any powder based materials, commonly metals and polymers |
| Sheet lamination | UAM (ultrasonic additive manufacturing) by Fabrisonic LLC; LOM (laminated object manufacturing) by Helisys Inc. | Paper, plastic, and some sheet metals |
| Vat Photopolymerization | SLA ® (stereolithography) 3D Printers by 3D Systems, Inc.; DLP (Digital Light Printing) | UV-curable photopolymer resin |

From the Table above, the powder-based AM processes, such as binder jetting and powder bed fusion processes, could potentially be used for manufacturing 3D glass articles because of the ready availability of amorphous glass soot powder. However, loose glass soot, unlike metal powders for example, is highly porous, shrinking multiple times in volume when sintered to a solid, which would make it difficult to achieve a 3D glass with good dimensional accuracy. Binder jetting involves dispensing a liquid binder into a powder bed. The binder would have to be removed from the object when building of the object is complete. Incomplete removal of additives from the microstructure of the object can result in a final 3D glass that is not fully transparent or that has poor transmission compared to 3D glass made by the traditional methods.

SUMMARY

AM processes for making 3D objects are disclosed. The disclosed AM processes are suitable for making transparent 3D glass objects with complex features. The AM processes can also be applied to other types of materials besides glass.

In one illustrative embodiment, an AM process includes providing a description of an object as a set of at least two cross-sectional layers that can be stacked together to form the object. The process includes providing a plurality of sheet materials, each sheet material corresponding to one of the cross-sectional layers of the object. The process includes forming an object material stack by stacking the sheet materials one on top of another and joining each overlying sheet material to an underlying sheet material without use of binder material between the sheet materials. The process includes forming at least one feature of at least one cross-sectional layer in the corresponding sheet material.

In another illustrative embodiment, an AM process includes providing a description of an object as a set of at least two cross-sectional layers that can be stacked together to form the object. The process includes forming a laminated soot sheet including at least two soot layers. Each soot layer corresponds to one of the cross-sectional layers. The process includes forming at least one feature of at least one of the cross-sectional layers in the corresponding soot layer. The process includes sintering the laminated soot sheet into densified glass.

In yet another illustrative embodiment, a manufactured article includes three or more glass layers laminated together with each glass layer being at least partially overlapped with another glass layer and without any binder material in between the glass layers. Each glass layer has a thickness in a range from 1 μm to 500 μm, and at least one of the glass layers is composed of silica or doped silica. At least one feature is formed in at least one of the glass layers. The at least one feature may be a through-hole, a partial-depth hole, a channel, a slot, a void, an engraved mark, or a differentiated area in the at least one of the glass layers.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

DETAILED DESCRIPTION

Figure 1:
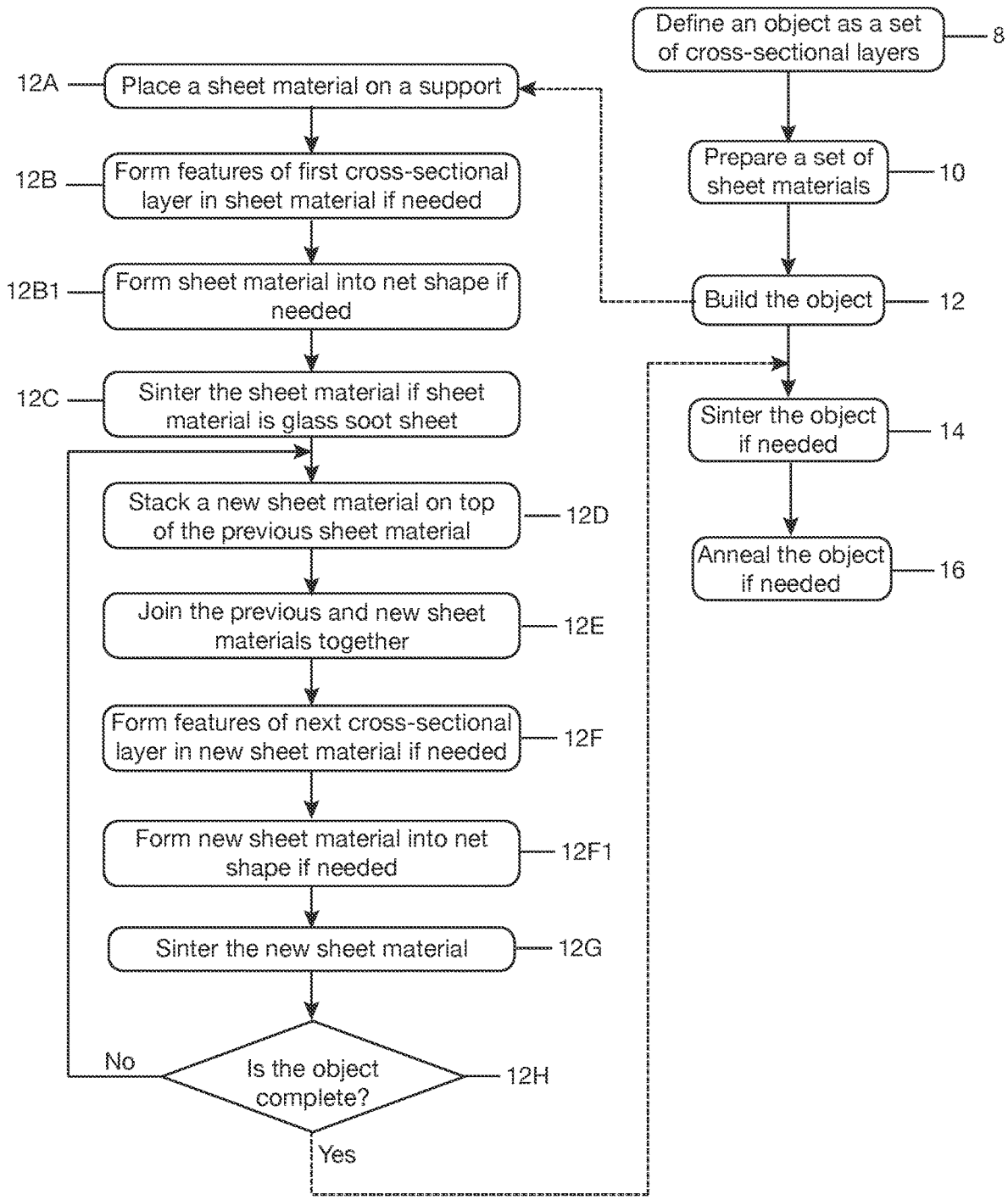
FIG. 1 is a flowchart illustrating a process for making a 3D object according to one embodiment.

FIG. 1 illustrates an AM process for making a 3D object according to one embodiment. The process generally includes stacking sheet materials one on top of another, joining the sheet materials in the stack together without use of binding material, and selectively forming features of cross-sectional layers of the 3D object in the sheet materials.

In one embodiment, the process includes defining a set of cross-sectional layers that can be stacked one on top of another to form a 3D object (8). Such definition may be made using suitable CAD and slicing software, as is known in the art of 3D printing, or using other suitable drawing tool. In one embodiment, the set contains at least two cross-sectional layers. In another embodiment, the set contains at least three cross-sectional layers.

In one embodiment, the process includes preparing a set of sheet materials for use in building the cross-sectional layers of the 3D object (10). Each cross-sectional layer of the 3D object may be built using one or more sheet materials. A sheet material may have one or more layers of material formed into a sheet. Preparation of the sheet materials may involve one or more of obtaining the sheet materials from a suitable source; slicing or dicing a material ribbon into the sheet materials; machining the sheet materials, e.g., to remove rough edges and/or smoothen surfaces of the sheet materials; and cutting the sheet materials into net sizes and shapes. Preparation of the sheet materials may also include preheating the sheet materials.

In one embodiment, the sheet materials are very thin to allow efficient laser processing of the materials. In one embodiment, the thickness of each sheet material may be in a range from 1 μm to 1 mm. In another embodiment, the thickness of each sheet material may be in a range from 1 μm to 500 μm. In yet another embodiment, the thickness of each sheet material may be in a range from 1 μm to 150 μm. The thicknesses of the sheet materials in the set may or may not be the same. In general, each sheet material in the set will have a uniform thickness. However, there may be instances where sheet materials having non-uniform thicknesses may be more suitable.

The material compositions of the sheet materials may be the same or may be different depending on the desired properties of the final 3D object. In one embodiment, the sheet materials are glass sheets. In one embodiment, the glass sheets may be soot sheets. As described in U.S. Pat. No. 7,677,058 ('058 patent) to Hawtof et al., a soot sheet is a sheet material having at least one soot layer, wherein the glass soot particles are connected and bonded with at least part of the particles proximate thereto, which is in contrast to loose glass soot particles (or glass powder). The glass soot sheet may have a uniform composition or a variable composition.

In another embodiment, the glass sheets may be sintered sheets. Such a sintered sheet may be made by sintering a soot sheet, as described in, for example, the '058 patent. As explained in the '058 patent, a sintered sheet will have a density higher than or equal to 95% of the highest possible density of a glass material having the same chemical composition and microstructure under standard temperature and pressure conditions (101.325 kPa, 273 K).

In yet another embodiment, the glass sheets may be fusion-formed glass sheets, i.e., glass sheets obtained from a glass ribbon formed by a fusion process. In other embodiments, the glass sheets may be made by other processes such as the float process and the like.

In one embodiment, the glass sheets are made of high purity fused silica or doped silica. For doped silica, the dopants will be selected based on the desired attributes of the final 3D object. For example, silica may be doped with titania to form an ultra-low expansion glass. In another example, the glass sheets may be alkali aluminosilicate glasses or other types of glasses that can be ion-exchanged. In another embodiment, the sheet materials may be glass-ceramic sheets. In general, the sheet materials may be made of inorganic materials.

The process of FIG. 1 includes building the 3D object using the sheet materials and the cross-sectional layer definition of the 3D object (12). In one embodiment, the build process includes placing a first sheet material on a support (12A). It is not necessary to physically attach the sheet material to the support, although force may be applied to clamp the sheet material to the support when working on the sheet material. The first sheet material will correspond to the first cross-sectional layer of the 3D object.

The build process may include forming one or more features of the first cross-sectional layer of the 3D object in the first sheet material (12B). In general, features may be formed in a sheet material using one or more of the following methods: removing material from select areas of the sheet material, adding material to select areas of the sheet material, and modifying at least one material property in select areas of the sheet material.

Examples of features that may be formed by removing material from select areas of a sheet material include, but are not limited to, through-holes, partial-depth holes, channels, slots, voids, and engraved marks. Through-holes and partial-depth holes are typically cylindrical in shape and may have a diameter of 30 microns or less. Voids may be cylindrical or non-cylindrical in shape and may have a size comparable to or much larger than the through-holes and partial-depth holes. Engraved marks generally consist of shallow grooves forming a pattern or design. In one embodiment, material may be removed from the sheet material by laser machining. In general, laser machining involves exposing select areas of the sheet material to at least one laser beam. The laser beam will heat up and ablate the sheet material wherever the sheet material is exposed to radiation from the laser beam with sufficient power density. For glass and glass-ceramic materials, the laser beam may be an infrared beam. In general, the laser beam should be provided at a wavelength at which the sheet material will be absorbing. In another embodiment, material may be removed from the sheet material by other beam machining methods or by CNC machining.

Examples of features that may be formed by adding material to select areas of a sheet material include, but are not limited to, partial-depth holes, channels, slots, and voids. For example, partial sheet materials can be added to the sheet material to form a channel or slot. Adding of feature material to the sheet material may include bonding the feature material to the sheet material. Preferably, any such bonding does not involve use of binder material. For example, thermal bonding could be used to add the feature material to the sheet material.

Features formed by modifying at least one material property in select areas of a sheet material may be referred to as "differentiated areas." Examples of material properties that could be modified to produce the differentiated areas include, but are not limited to, composition, refractive index, coefficient of thermal expansion, crystallinity, conductivity, transmission, and loss. The differentiated areas may form a select pattern in the sheet material, such as a waveguide pattern and the like. In one embodiment, the differentiated areas may be formed in the sheet material by applying at least one laser beam to select areas of the sheet material. This laser beam may be different from the one used to form other types of features in the sheet material.

In one embodiment, the sheet material may be a photosensitive glass. A photosensitive glass is a glass that upon exposure to short wave radiation, such as ultraviolet radiation, develops coloration in the exposed areas while the unexposed areas remain unchanged. U.S. Pat. No. 2,515,936 (Armistead, Jr., 1950) describes a photosensitive glass produced by incorporating silver chloride or silver halide into a silicate glass. This glass is capable of developing a yellow or amber color with UV light exposure. U.S. Pat. No. 3,208,860 (Armistead, Jr., 1965) discloses another example of a photosensitive glass produced by forming microcrystals of at least one silver halide selected from silver chloride, silver bromide, and silver iodide in a silicate glass. A differentiated area may be formed in a photosensitive sheet material by exposing a select area of the sheet material to ultraviolet radiation.

The build process may include forming the first sheet material into a net shape, e.g., if the first sheet material does not have the net shape of the first cross-sectional layer (12B1). Forming the first sheet material into a net shape may involve removing material from a periphery of the first sheet material or adding material to a periphery of the first sheet material. Any suitable method may be used for removing material from the periphery of the first sheet material, such as laser machining or other beam machining method or CNC machining, in order to form the net shape. Similarly, any suitable method, typically one that does not involve use of binder material such as adhesive and the like, may be used to add material to the periphery of the first sheet material. Alternatively, any net shaping of the first sheet material may be deferred until the building of the 3D object is complete.

If the first sheet material is a glass soot sheet, the build process may include sintering the first sheet material (12C). The sintering may or may not result in a fully dense glass. In one embodiment, the glass soot sheet may be sintered using heat from at least one laser beam. In another embodiment, the glass soot sheet may be sintered in an oven using a heat source other than a laser beam.

The build process includes stacking a second sheet material on top of the first sheet material (12D). The build process further includes joining the second sheet material to the first sheet material (12E), thereby forming an object material stack. The object material stack can grow as additional sheet materials are joined to the sheet materials already in the stack. In one embodiment, joining of the sheet materials does not involve use of binder material, such as adhesive and the like, between the sheet materials. In one embodiment, the second sheet material is joined to the first sheet material using heat generated by at least one laser beam. The joining process may include focusing at least one laser beam on the stack of first and second sheet materials, e.g., at or near an interface between the first and second sheet materials. The laser beam may be focused to a point, line, or volume. The focused laser beam is then scanned across the stack. During the scanning, either or both of the first and sheet materials can be melted and/or sintered to fuse the sheet materials together. The melting and/or sintering may be localized to the interface between the sheet materials or may be applied across the entire volume of the stack. In other embodiments, a different heat source besides a laser beam may be used for the joining of the sheet materials.

In one embodiment, a clamping force is applied to the stack of materials while using a laser beam to join the sheet materials. The clamping force will force the sheet materials together, thereby ensuring intimate contact at the interface between the sheet materials, which would allow a good bond that is essentially free of entrapped air and particles to be formed between the sheet materials. Any suitable device may be used to provide the clamping force. For example, weighted rollers positioned on top of the stack may provide the clamping force. Another example is a nozzle or the like that directs a gas jet to the top of the stack. The force of the gas jet will push the stack in the direction of the support and thereby force the sheet materials in the stack together. Another example is vacuum clamping. For example, vacuum holes may be formed in the first sheet material, and vacuum can be applied through these vacuum holes to draw the second sheet material against the first sheet material during the joining of the sheet materials.

The build process may include forming features of the second cross-sectional layer of the 3D object in the second sheet material (12F). The process for forming such features and examples of features are as described above for the first sheet material. The second sheet material may be formed into a net shape, e.g., if the second sheet material does not have the net shape of the second cross-sectional layer (12F1). Net shaping may be as described above for the first sheet material.

If the second sheet material is a glass soot sheet, the build process may include sintering the second sheet material (12G). The glass soot sheet may or may not be sintered into fully dense glass. Also, sintering may be by heat generated by at least one laser beam or in an oven using a heat source other than a laser beam. In one embodiment, laser sintering of the second sheet material may occur while joining the second sheet material to the first sheet material using at least one laser beam. That is, the joining of the first and second sheet materials together using a laser beam may automatically result in at least partial sintering of the second sheet material. Also, if the first sheet material is provided as a glass soot sheet and was not sintered before the joining of 12E, the first sheet material can be sintered either while joining the first sheet material to the second sheet material or after joining the first sheet material to the second sheet material.

The build process includes determining if all the cross-sectional layers of the 3D object have been built into corresponding sheet materials (12H). If not, another sheet material is stacked on top of the object material stack (repeat of 12D) and joined to the top of the object material stack (repeat of 12E). Both of these stacking and joining sub-processes are as described above for the first and second sheet materials. The features of the next cross-sectional layer is formed in the new sheet material in the object material stack (repeat of 12F), as described for the second sheet material above. Net shaping of the new sheet material may be carried out (repeat of 12F1), as described for the second sheet material above. The new sheet material may be sintered if needed (repeat of 12G), as described for the second sheet material above. The sub-processes (12D-12G) are repeated for each new sheet material until building of the 3D object is complete.

The process of making the 3D object may include a final sintering of the 3D object if needed (14), e.g., if the sintering sub-processes (12C, 12G) were not carried out or were only carried out partially during the building of the 3D object. The heating source for this final sintering may be a laser beam or other suitable source known in the art. It will not be necessary to de-bind the 3D object since binders are not used in joining the sheet materials together while building the 3D object. Also, it may be necessary to anneal the 3D object to relieve internal stresses in the 3D object (16).

One variation to the process of FIG. 1 involves disposing fill material in select features while building the 3D object. For example, assume that a void feature was formed in the second sheet material in the object material stack and that this void should contain gas when the 3D object is complete. In this case, before adding the third sheet material to the object material stack, the object material stack can be placed in a stream of flowing gas to allow the void in the second sheet material to be filled with the gas. To trap the gas in the void, the third sheet material is stacked on top of the second sheet material and joined to the second sheet material. This stacking and joining can be carried out in the stream of flowing gas. Alternatively, to fill the void in the second sheet material with liquid or solid material, the fill material can be loaded into the void, and the third sheet material can be stacked on top of the second sheet material to trap the fill material in the void. Thus filling of voids can be carried out generally contemporaneously with stacking and joining of a new sheet material to a previous sheet material in the object material stack.

Another variation of the process of FIG. 1 may involve preheating the sheet materials if the sheet materials are made of a relatively high thermal expansion material. Thus, for example, silica is a low thermal expansion material. If the sheet materials are made of silica, preheating of the sheet materials may not be needed. However, if the sheet materials are made of a material having a high thermal expansion compared to silica, then preheating of the sheet materials may be needed. Such preheating may be carried out prior to placing the sheet material on the support or prior to joining the sheet material to another sheet material in a stack. In addition, for sheet materials having a relatively high thermal expansion, the process of FIG. 1 may involve annealing the sheet materials during and after building of the 3D object.

Figure 2A:
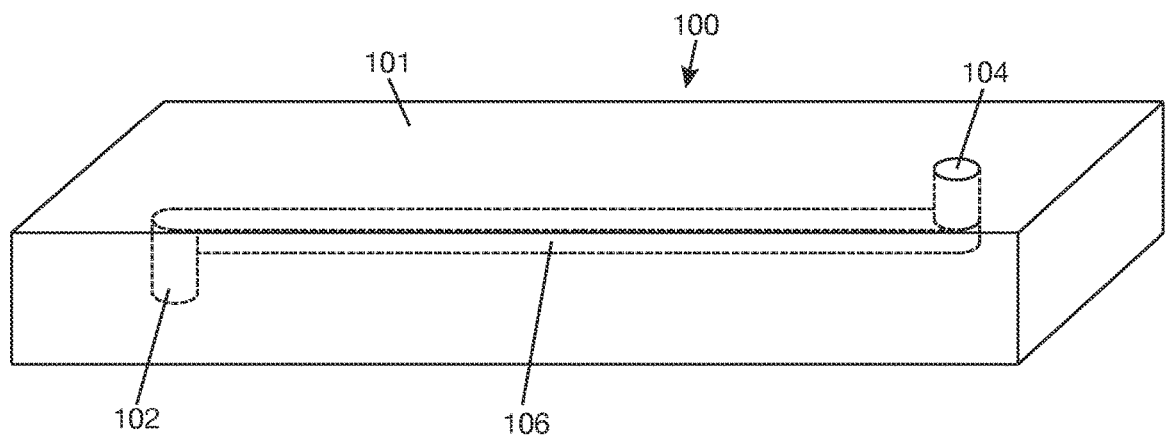
FIG. 2A shows an example of a 3D object.
Figure 2B:
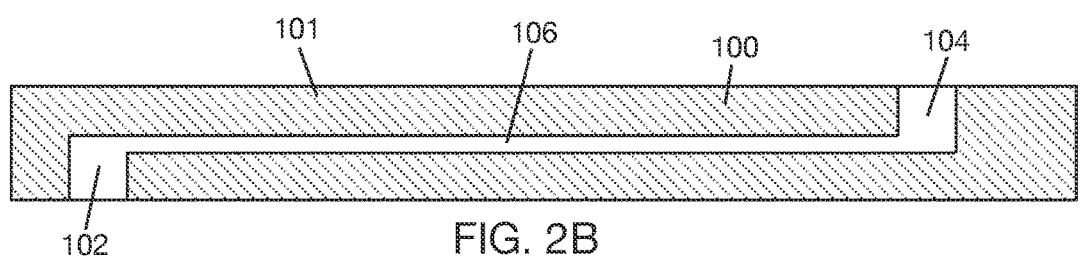
FIG. 2B is a cross-section of the 3D object shown in FIG. 2B.
Figure 2C:
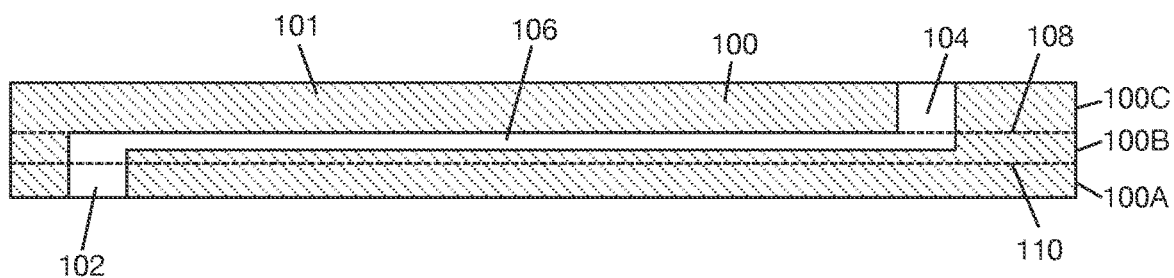
FIG. 2C shows the 3D object of FIGS. 2A and 2B sliced into cross-sectional layers.

The process of FIG. 1 may be further illustrated by way of an example 3D object such as shown at 100 in FIGS. 2A and 2B. The example 3D object 100 includes a flat substrate 101 in which holes 102, 104 and channel 106 are formed. The 3D object 100 may be sliced into cross-sectional layers along the slice lines 108, 100 shown in FIG. 2C. The location and number of slice lines may be selected for ease of constructing the 3D object and are not limited to what is shown in FIG. 2C. The first cross-sectional layer 100A includes a bottom part of the hole 102. The second cross-sectional layer 100B includes a top part of the hole 102, the entire channel 106, and a bottom part of the hole 104. The third cross-sectional layer 100C includes a top part of the hole 104. The holes 102, 104 and channel 106 are features of their respective cross-sectional layers. To build the 3D object 100, three sheet materials will be needed, one for each of the three cross-sectional layers 100A, 100B, 100C. The thicknesses of the sheet materials should correspond to the thicknesses of the cross-sectional layers.

Figure 3A:
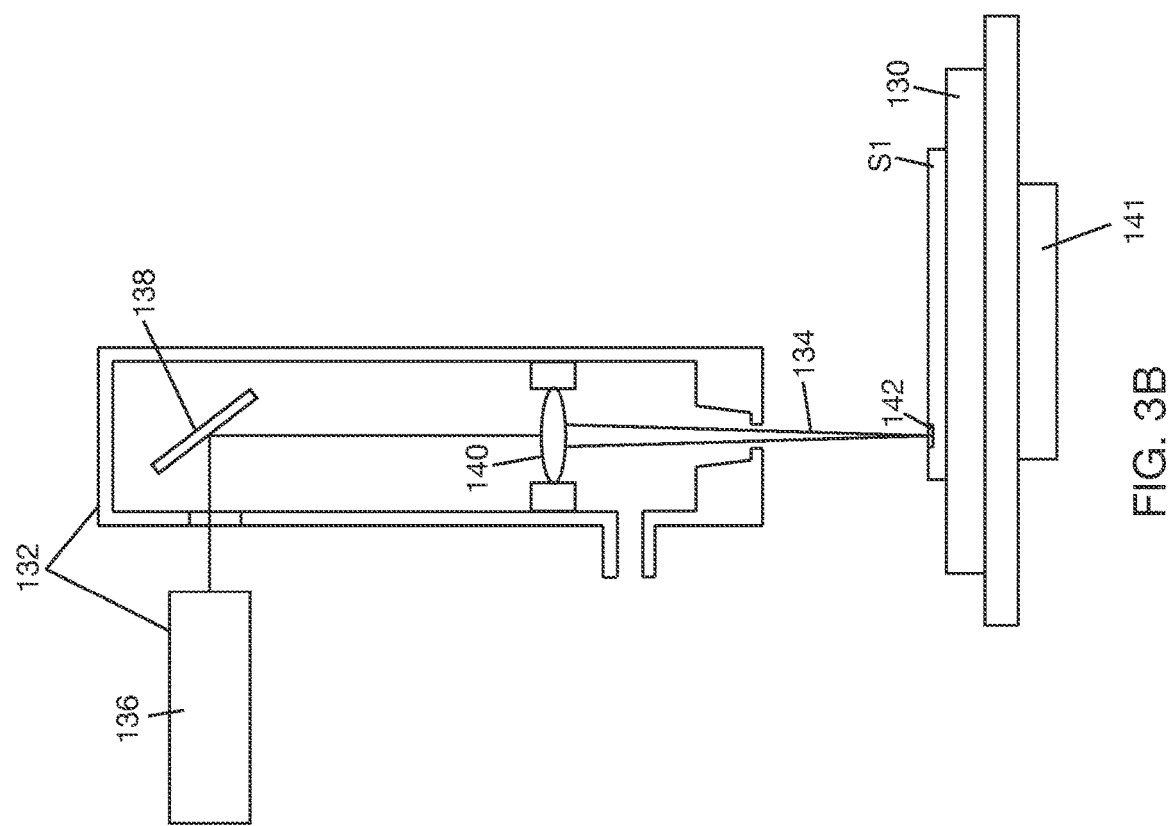
FIGS. 3A-3F illustrate a process of forming of the 3D object having the cross-sectional layers shown in FIG. 2C using the process of FIG. 1.

FIG. 3A shows a sheet material S1 placed on a support 130. A laser machine 132 is arranged to provide a laser beam 134 to the sheet material S1. The laser machine 132 may have any suitable configuration for providing a laser beam for laser processing of a material. In one example, the laser machine 132 may include a laser source 136, a mirror 138 for reflecting the beam from the laser source 136, and a lens 140 for focusing the reflected beam to the sheet material S1. The height of the lens 140 relative to the support 130 may be adjustable to allow the focus of the laser beam 134 to be placed at different positions relative to the support 130. The support 130 is mounted on a motion translation stage 141, which would allow the support 130 to move relative to the laser beam 134 so that the laser beam 134 can scan the sheet material S1. Alternatively, the laser machine 132 may use optics such as scanning mirrors to move the laser beam 134 across the sheet material S1. Or the laser machine 132 itself, or parts thereof, may be movable to provide the desired scanning of the laser beam 134 across the sheet material S1. Although not shown, the laser machine 132 may include a beam shaper for shaping the laser beam 134 into a non-round shape, such as rectangular shape or elliptical shape.

Figure 3B:
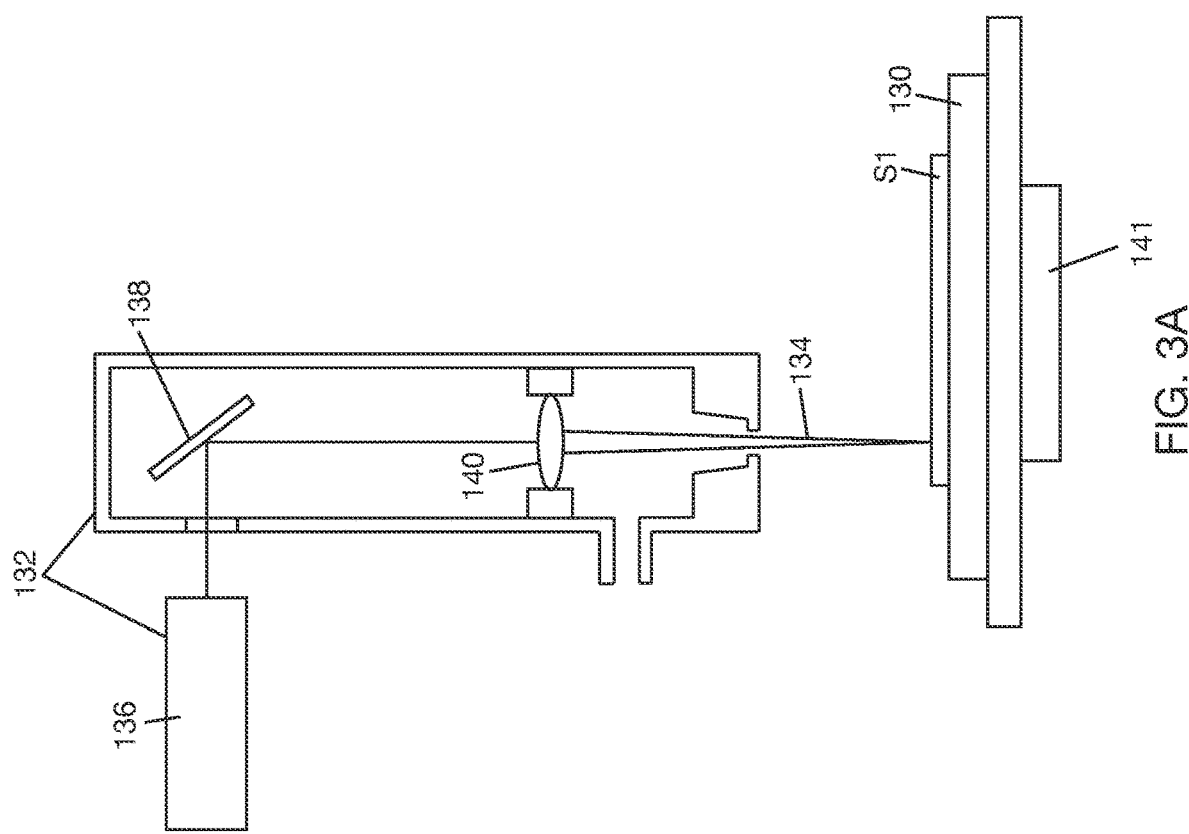

FIG. 3B shows the laser beam 134 forming the features of the first cross-sectional layer (100A in FIG. 2C) in the sheet material S1. In this example, the laser beam 134 is machining a hole 142 (corresponding to the bottom part of the hole 102 in FIG. 2C) in the sheet material S1. The laser beam 134 machines the hole 142 by delivering heat to a local area of the sheet material S1 in which the hole is to be formed. The heat will burn off or vaporize the area of the sheet material S1 to form the hole. The duration of the heating and intensity of the heating will affect the depth of the hole 142 in the sheet material S1. The laser source 136 will need to be selected based on the properties of the sheet material S1. In general, the laser source 136 will need to be able to provide the laser beam 134 in the absorbing range of the sheet material S1 so that the select area can be ablated.

Before or after machining the hole 142, the laser beam 134, which may be provided at the same or a different power level than used for machining the hole 142, may be swept across the sheet material S1 to sinter the sheet material S1 into dense glass, i.e., if the sheet material S1 is a glass soot sheet.

Figure 3C:
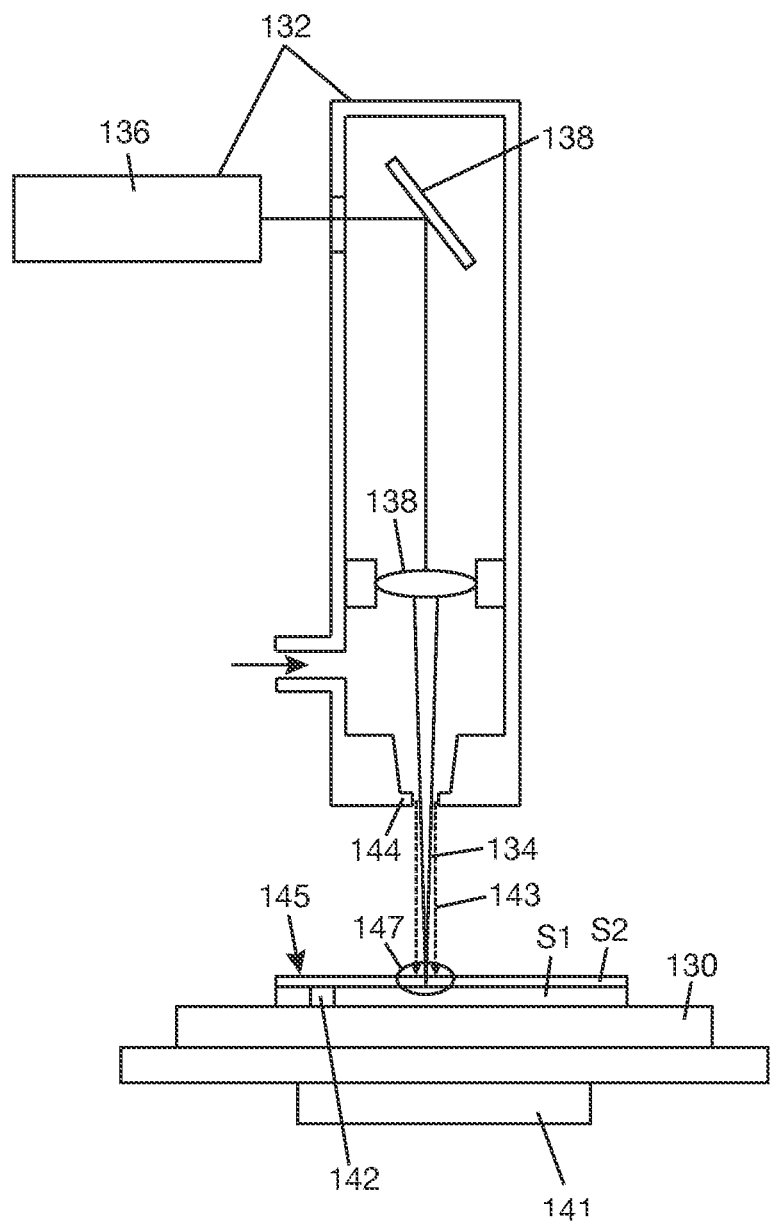

FIG. 3C shows a sheet material S2 stacked on the sheet material S1. The laser machine 132 directs the laser beam 134 to the stack of sheet materials S1, S2 to join the sheet materials S1, S2 and form an object material stack 145. To join the sheet materials S1, S2 together, the laser beam 134 is scanned across the stacked sheet materials S1, S2, where the heat generated by the laser beam 134 melts and/or sinters the sheet materials S1, S2 at least near the interface between the sheet materials S1, S2 to form a bond between the sheet materials S1, S2. In this example, a gas jet 143 from a nozzle 144 applies a clamping force to the sheet material stack so that the sheet materials S1, S2 are in intimate contact at least in a zone 147 where the laser beam 134 is being applied. The clamping force will allow a good bond to be formed between the sheet materials S1, S2 by the laser energy. Mechanical means such as weighted rollers and the like may be used in lieu of the gas jet to apply a clamping force to the stack. Vacuum clamping may also be used in lieu of the gas jet.

Figure 3D:
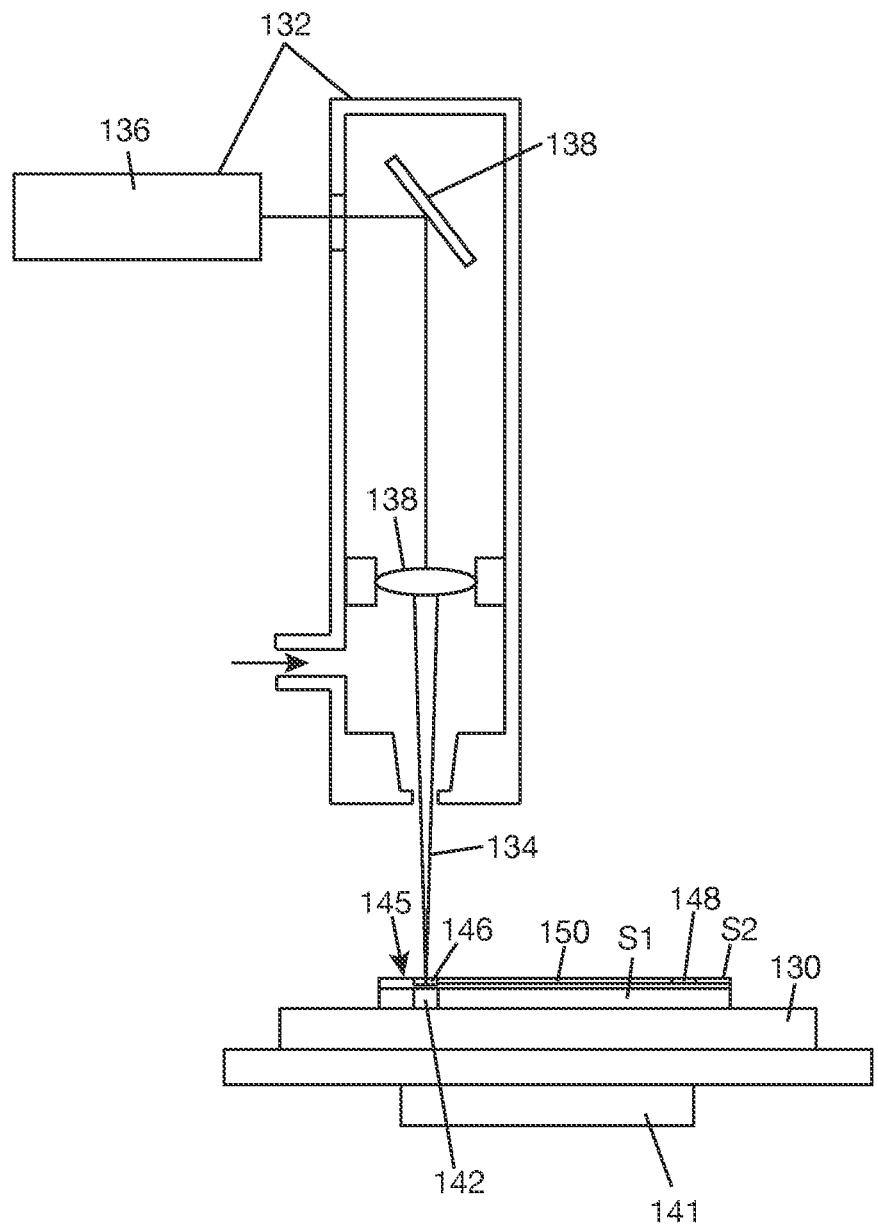

FIG. 3D shows the laser beam 134 machining features of the second cross-sectional layer (100B in FIG. 2C) in the sheet material S2. In this example, the laser beam 134 is machining holes 146, 148 (corresponding to the holes 102, 104 in FIG. 2C) and channel 150 (corresponding to channel 106 in FIG. 2C) in the sheet material S2. The laser beam 134 machines the holes 146, 148 and channel 150 in the same manner described for machining the hole 142 (in FIG. 3B) in the sheet material S1. The holes 146, 148 and channel 150 may be machined at the same time, with the laser beam 134 moving back and forth across the sheet material S2 and delivering heat where needed across the sheet material S2. Before or after machining the holes 146, 148 and channel 150 in the sheet material S2, the laser beam 134 may be swept across the sheet material S2 to sinter the sheet material S2 into dense glass, i.e., if the sheet material is a glass soot sheet. Also, if the sheet material S1 is a glass soot sheet and is not yet fully consolidated, the laser beam 134 may sinter the sheet material S1 too. Either or both of the sheet materials S1, S2 may be sintered while joining the sheet materials S1, S2 together, i.e., sintering does not have to be carried out in a separate step from joining the sheet materials. On the other hand, it is possible to delay full sintering of the sheet material(s) until after the 3D object has been completely built.

Figure 3E:
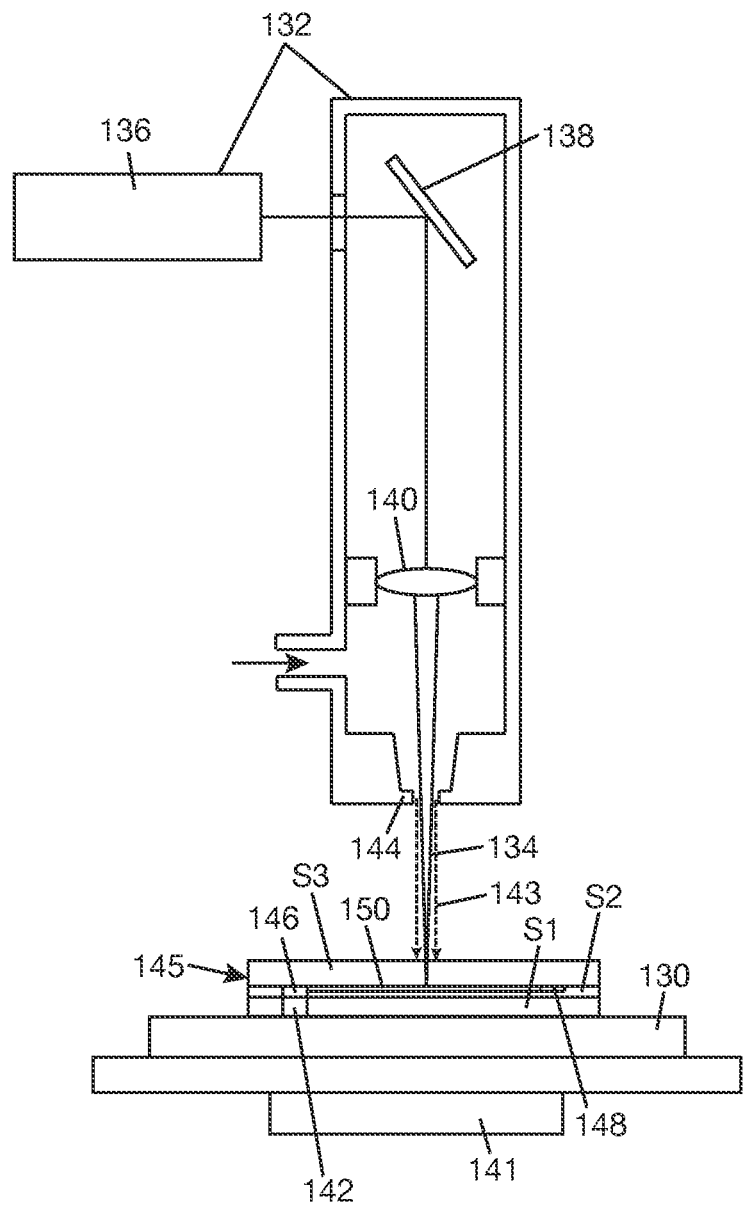
Figure 3F:
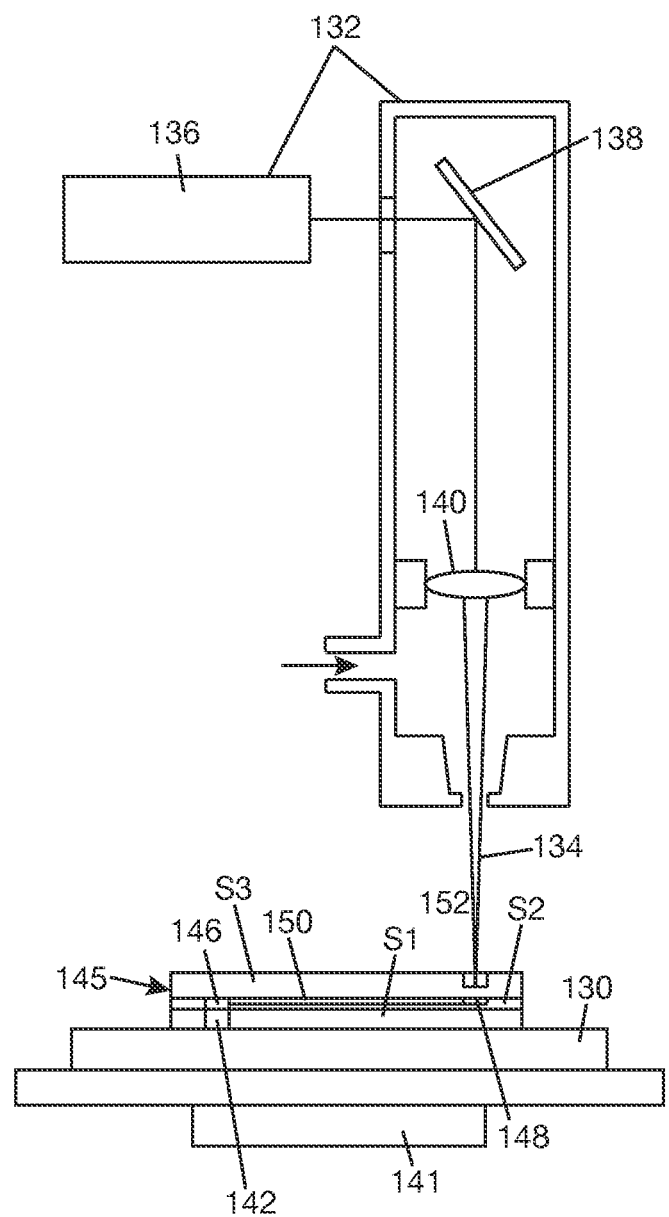

FIG. 3E shows a sheet material S3 stacked on the sheet material S2. The laser beam 132 directs the laser beam 134 to the stack of sheet materials S1, S2, S3 to join the sheet material S3 to the sheet material S2. After this joining, the object material stack 145 will have three sheet materials S1, S2, S3. FIG. 3F shows the laser beam 134 machining a hole 152 (corresponding to the top part of the hole 104 in FIG. 2C) in the sheet material S3 to complete the 3D object 100. Before or after machining the hole 152 in the sheet material S3, the laser beam 134 may be swept across the sheet material S3 to sinter the sheet material S3 into dense glass, i.e., if the sheet material S3 is a glass soot sheet.

In the example above and embodiments described herein, if the sheet materials S1-S3 are made of material(s) having a relatively high thermal expansion, e.g., relatively high compared to silica, the sheet materials S1-S3 may need to be preheated prior to using them to build the 3D object 100. Also, the sheet materials S1-S3 may be annealed during and after the build process to relieve internal stresses in the 3D object.

For processing of sheet materials made of glass, $CO_2$ laser is typically used. In general, it is preferred to have a laser source of appropriate penetration depth on the order of the layer thickness of the sheet material to be processed. However, the penetration depth of $CO_2$ laser in glass is typically limited to less than 10 ☐☐, which would limit the maximum layer thickness of the sheet material that can be used in the process. The 5-☐☐ laser (CO laser) has a deeper penetration depth and may extend the range of sheet material thicknesses that can be used in the process. In another approach, the composition of the sheet materials may be tailored such that visible or near-infrared lasers can be used in the process.

Figure 4:
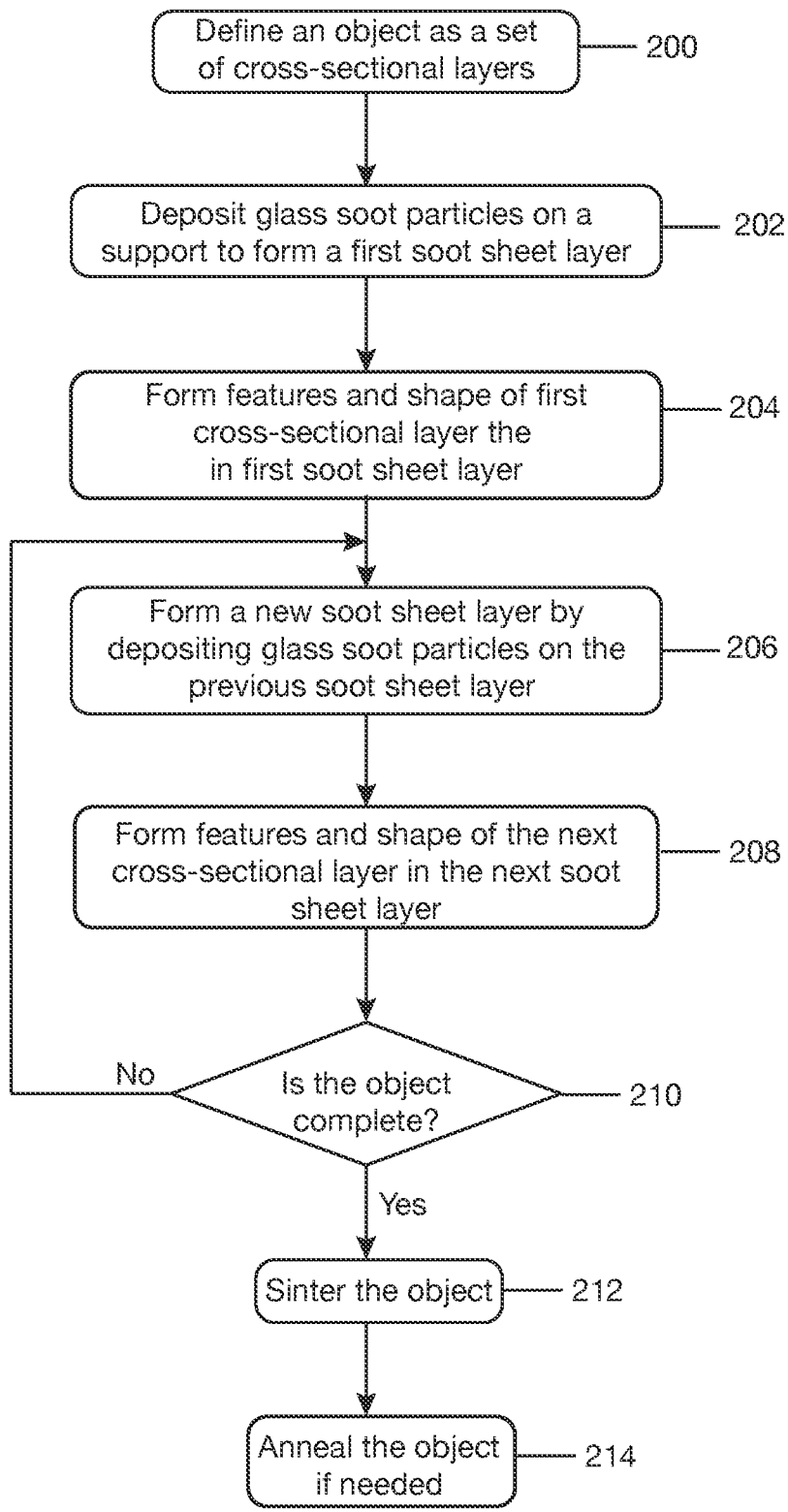
FIG. 4 is a flowchart illustrating a process for making a 3D object according to another embodiment.

In the example above and embodiments described herein, a single laser may be used to form features of cross-sectional layers in sheet materials, join sheet materials together, and sinter sheet materials. Alternatively, depending on material composition of the sheet materials, multiple laser sources with different wavelength may be used to form features of cross-sectional layers in sheet materials, join sheet materials, and sinter sheet materials FIG. 4 illustrates an AM process for manufacturing 3D glass objects according to another embodiment. The process generally involves building a 3D object layer by laser by forming a laminated sheet and selectively forming features of cross-sectional layers of the 3D object in the layers of the laminated sheet. In one embodiment, the process includes defining a set of cross-sectional layers that can be stacked one on top of another to form a 3D object (200). As in the previous process embodiment, the set will contain at least two cross-sectional layers. In some embodiments, the set may contain at least three cross-sectional layers.

The process includes depositing glass soot particles on a deposition surface to form a first soot layer (202). The thickness of the first soot layer will correspond to the thickness of the first cross-sectional layer of the 3D object. In one embodiment, the thickness of the first soot layer and each subsequent soot layer may be in a range from 1 μm to 500 μm. In one embodiment, the soot particles are high purity silica soot particles or doped silica soot particles. The soot particles may be made by a flame hydrolysis process, as described in, for example, U.S. Pat. No. 7,677,058 (the '058 patent) to Hawtof et al. The flame hydrolysis process generally involves supplying silica precursor, oxygen, fuel, and optionally doping material to one or more burners. Each burner uses the oxygen and fuel to generate a flame, which then reacts with the silica precursor and doping material, if present, to form soot. The soot is deposited on a deposition surface. In the '058 patent, a rotating drum is used as a deposition surface. However, the deposition surface does not have to be limited to a rotating drum. It could be a planar surface, for example. If a variable composition is desired within the soot layer, the materials delivered to the flame can be varied while depositing the soot on the deposition surface.

After the first soot layer has been formed, features of the first cross-sectional layer of the 3D object are formed in the first soot layer (204). Features are as described above for the process in FIG. 1 and may be formed in the same manner described above for the process in FIG. 1, i.e., by removing soot from select areas of the first soot layer, adding soot or other material to select areas of the first soot layer, and/or modifying soot in select areas of the soot layer. The features may be formed using laser energy or by other suitable methods, as described for the process of FIG. 1. If a feature is being formed by addition of soot to the first soot layer, the feature soot can be selectively deposited on the first soot layer by flame hydrolysis, as described above.

After the features of the first cross-sectional layer of the 3D object have been formed in the first soot layer, the first soot layer is returned to the soot forming area. The soot particles are deposited on the first soot layer to form a second soot layer on top of the first soot layer (206). The thickness of the second soot layer will correspond to the thickness of the second cross-sectional layer of the 3D object. The second soot layer and the first soot layer form a laminated soot sheet. At the temperature at which the soot particles are being deposited, some of the soot particles for the second soot layer will adhere to the first soot layer at the interface between the layers, providing a structure that is relatively stable. If the features formed in the first soot layer are open features such as holes and the like, there is a possibility of filling these features with the soot particles while depositing the soot particles on the first soot layer. If such filling is not desired, open features in the first soot layer may be filled with sacrificial material prior to depositing the second soot layer on the first soot layer. The laminated soot sheet may be transferred to the build area, where the features of the second cross-sectional layer may be formed in the second soot layer (208).

Depositing a new soot layer on a previous soot layer to increase layers of the laminated soot sheet and forming features of the next cross-sectional layer of the 3D object in the new soot layer of the laminated soot sheet can continue until all the cross-sectional layers of the 3D object have been built into corresponding soot layers (210). Finally, the built 3D object can be sintered into fully dense glass (212). If sacrificial material was used to fill open features in the 3D object, this sacrificial material may be burned off during the sintering. Filling of voids using gas, liquid, or solid material other than glass may also be combined with the process of FIG. 4, as described for the process of FIG. 1 above. Also, the 3D object may be annealed to relieve internal stresses (214).

EXAMPLE 1: A 100-µm thick glass soot sheet, comprised of 100% silica, was prepared using the process described in U.S. Pat. No. 7,677,058 to Hawtof et al. A 2-in. wide by 2-in. long piece of the sheet was laid on a translating table in proximity to a $CO_2$ laser. A similar piece of 100% silica glass soot sheet was laid on top of the first piece. The laser was Diamond E-400 pulsed $CO_2$ laser by Coherent. The laser has an output power of 400 W and a power range of 40 to 400 W. An asymmetric aspherical lens was positioned between the laser and the stack of glass soot sheets. The asymmetric aspheric lens generates a line beam of 50 mm long and approximately 1 mm with uniform intensity distribution across both long and short axis. The lens was placed roughly 380 mm away from the top of the soot sheet stack. A laser power of 185 W at a beam width of 50 mm was used to melt the pieces of glass together. The beam was moved at 1.6 mm/s across the glass sheet stack. Clear, sintered glass, fully densified and bonded together was created in the path of the beam. This example demonstrates the feasibility of simultaneously joining glass soot sheets together and sintering the glass soot sheets into dense glass using laser energy.

EXAMPLE 2: A 100-µm thick soot layer, comprised of 100% silica, was prepared using the process described in U.S. Pat. No. 7,677,058 to Hawtof et al. The A $CO_2$ laser beam was focused down to approximately 200 µm in diameter. The focused laser beam was manipulated using a galvanometer scanner to cut out a 2D pattern on the soot layer. The cutting speed was 150 mm/s. This example demonstrates the feasibility of forming features in a soot layer or sheet.

The AM processes described in FIGS. 1 and 4, and variations thereof, enable manufacture of transparent 3D objects. The processes do not use binders whose incomplete removal from the 3D object can result in lack of full transparency of the object. The 3D objects can have transparency in the visible range or in other ranges besides the visible range, depending on the composition of the sheet materials or soot layers used in building the 3D objects. In one embodiment, a 3D object will be considered to be transparent if it has a transmittance of at least 80% in a range from 390 nm to 700 nm as measured by a spectrophotometer.

The AM processes described in FIGS. 1 and 4 enable manufacture of a 3D glass article with features of varying complexities in a very thin form factor, e.g., from a few microns to a few millimeters thick. The thickness of the 3D glass article will be determined by the combined thicknesses of the sheet materials or soot layers used in building the article.

The AM processes described in FIGS. 1 and 4, and variations thereof, enable manufacture of a, 3D glass article having good dimensional accuracy. Any sintering of the article will not be accompanied by the large shrinkage typically associated with powder-based AM processes.

A 3D glass article made according to the processes of FIGS. 1 and 4, and variations thereof, may find uses in a myriad of detector and/or analyzer applications depending on the structure and arrangement of the features of the article. Examples of such applications include, but are not limited to, microfluidic devices, flexible biosensors, drug discovery tools, bioterrorism detection, food safety detection, water contamination detection, blood testing for oxygen level and other attributes, drug testing, electrical level measurement, magnetic level measurement, radioactive level measurement, gravitational level measurement, light level measurement, fingerprinting sensing, and bio-sensing.

In one embodiment, a 3D glass article manufactured using the process described in FIG. 1 or FIG. 4 has at least three glass layers. The glass layers are laminated together such that each glass layer at least partially overlaps another glass layer. Each glass layer may be contributed by a sheet material, as in the process of FIG. 1, or by a soot layer, as in the process of FIG. 4. Lamination of the glass layers may be by applying heat from a laser beam to the glass layers or by another method that does not involve use of binder material between the glass layers. According to the processes described in FIGS. 1 and 4, there is no binder material in between the glass layers. In one embodiment, each glass layer may have a thickness in a range from 1 µm to 1 mm. In another embodiment, each glass layer may have a thickness in a range from 1 µm to 500 µm. In yet another embodiment, each glass layer may have a thickness in a range from 1 µm to 150 µm. In one embodiment, at least one of the glass layers is composed of silica or doped silica. In one embodiment, at least one of the glass layers includes at least one feature. In one embodiment, the feature may be selected from a through-hole, a partial-depth hole, a channel, a slot, a void, an engraved mark, or a differentiated area.

In one embodiment, the glass layers of the 3D glass article may be sintered sheets.

In one embodiment, at least one of the glass layers of the 3D glass article may have a variable composition within the layer.

In one embodiment, at least one of the glass layers of the 3D glass article is a porous glass. The porous glass may have a density in a range from 0.4 to 2.2 g/cm$^3$.

In one embodiment, at least one of the glass layers of the 3D glass article is a porous glass and at least another of the glass layers of the 3D glass article is a fully dense glass.

In one embodiment, at least one of the glass layers of the 3D glass article includes a void as a feature, and the void is at least partially filled with a gas or a liquid or a solid material other than glass.

In one embodiment, a difference in index of refraction between adjacent glass layers of the 3D glass article is less than 2%.

In one embodiment, the 3D glass article has internally exposed surfaces and a surface smoothness of the internally exposed surfaces is less than 50 nm Ra.

In one embodiment, the 3D glass article has a transmission of 93% or greater.

Figure 5:
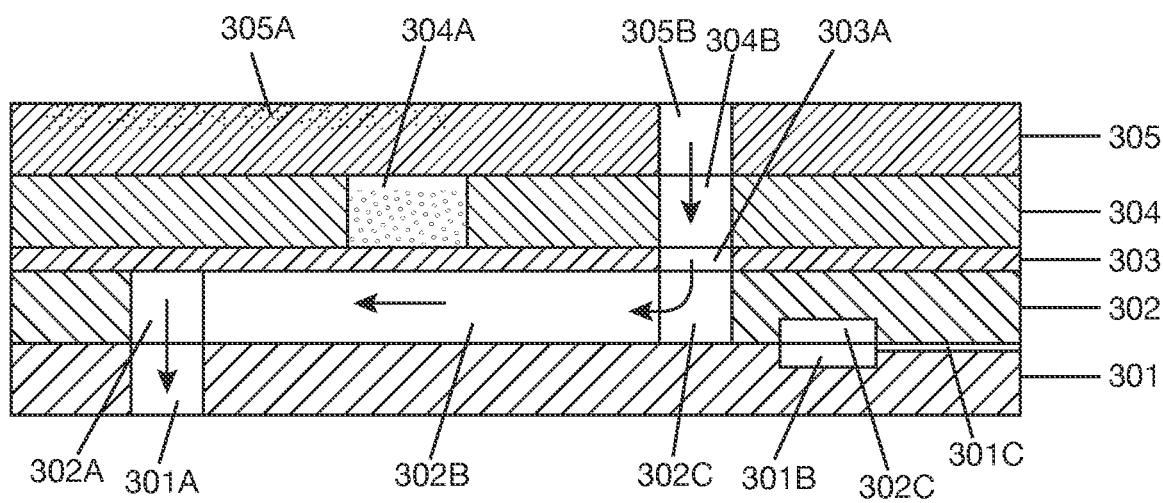
FIG. 5 shows an example article that may be manufactured using the process of FIG. 1 or FIG. 4.

FIG. 5 shows a fairly complex 3D glass article 300 demonstrating the characteristics described above. It should be noted that the number, structure, and arrangement of the features in the 3D glass article 300 will depend on the particular use of the 3D glass article and are not limited to what is shown in FIG. 5. For illustration purposes, the 3D glass article 300 has glass layers 301, 302, 303, 304, 305. Through-hole 301A and partial-hole 301B are formed in the first glass layer 301. Through-hole 302A, channel 302B, and partial-hole 302C are formed in the second glass layer 302. Through-hole 303A is formed in the third glass layer 303. Void 304A and through-hole 304B are formed in the fourth glass layer 304. In one embodiment, a filler material, which may be a gas, liquid, or solid material other than glass, is disposed in the void 304A. Differentiated area 305A and through-hole 305B are formed in the fifth glass layer 305. The differentiated area 305A has at least one material property that is different compared to the rest of the fifth glass layer 305. In one embodiment, the at least one material property may be selected from composition, refractive index, coefficient of thermal expansion, crystallinity, conductivity, transmission, and loss. The various holes may have a diameter of 30 microns or less. The surfaces of the holes and channel are internally exposed. These surfaces may have a surface smoothness less than 50 nm RA. The partial holes 301B and 302C define a void between the glass layers 301, 302. A channel 301C may form a connection between the void and the outer surface of the 3D glass article.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A manufactured article, comprising:
   three or more glass layers laminated together with each glass layer being at least partially overlapped with another glass layer and without any binder material in between the glass layers, each glass layer having a thickness in a range from 1 µm to 500 µm, at least one of the glass layers being composed of silica or doped silica;
   a first feature formed, respectively, in at least two of the glass layers, wherein the first feature defines an open channel with a first portion and a second portion having a fluidic connection therebetween, and wherein the first portion of the open channel extends transversely relative to the second portion of the open channel, and
   at least one further feature formed in at least one of the glass layers, the at least one further feature being a through-hole, a partial-depth hole, a slot, a void, an engraved mark, or a differentiated area in the at least one of the glass layers.

2. The manufactured article of claim 1, wherein at least one of the glass layers has a variable composition within a material of the layer.

3. The manufactured article of claim 1, wherein at least one of the glass layers is a porous glass having a density in a range of from 0.4 g/cm$^3$ to 2.2 g/cm$^3$.

4. The manufactured article of claim 3, wherein at least another one of the glass layers is fully dense glass.

5. The manufactured article of claim 1, wherein the at least one further feature is a void, and wherein the void is at least partially filled with a gas, a liquid, or a solid material other than glass.

6. The manufactured article of claim 1, wherein the at least one further feature is a differentiated area, and wherein the differentiated area has at least one material property that is different compared to the rest of the at least one of the glass layers.

7. The manufactured article of claim 6, wherein the at least one material property is composition, refractive index, coefficient of thermal expansion, crystallinity, conductivity, transmission, or loss.

8. The manufactured article of claim 1, further comprising another feature in another glass layer adjacent to the at least one of the glass layers, the at least one further feature and the another feature defining at least one void between the another glass layer and the at least one of the glass layers.

9. The manufactured article of claim 1, further comprising a connection between an outer surface of the glass layers and one or more of the first feature and the at least one further feature.

10. The manufactured article of claim 1, wherein a difference in index of refraction between adjacent glass layers is less than 2%.

11. The manufactured article of claim 1, wherein the glass layers define at least one internally exposed glass surface within the glass layers, and wherein a surface smoothness of the at least one internally exposed glass surface is less than 50 nm Ra.

12. The manufactured article of claim 1, which has a transmission of at least 93% in a range of from 390 nm to 700 nm.

13. The manufactured article of claim 1, wherein at least two of the glass layers have different compositions.

14. A manufactured article, comprising:
   three or more glass layers laminated together with each glass layer being at least partially overlapped with another glass layer and without any binder material in between the glass layers, each glass layer having a thickness in a range from 1 µm to 500 µm, at least one of the glass layers being composed of silica or doped silica; and
   at least one feature formed in at least one of the glass layers, the at least one feature being a through-hole, a partial-depth hole, a channel, a slot, a void, an engraved mark, or a differentiated area in the at least one of the glass layers,
   wherein at least one of the glass layers is a porous glass having a density in a range of from 0.4 g/cm$^3$ to 2.2 g/cm$^3$.

15. A manufactured article, comprising:

three or more glass layers laminated together with each glass layer being at least partially overlapped with another glass layer and without any binder material in between the glass layers, each glass layer having a thickness in a range from 1 μm to 500 μm, at least one of the glass layers being composed of silica or doped silica; and at least one feature formed in at least one of the glass layers, the at least one feature being a through-hole, a partial-depth hole, a channel, a slot, a void, an engraved mark, or a differentiated area in the at least one of the glass layers, wherein at least two of the glass layers have different compositions, wherein the at least one feature comprises a first feature configured as an open channel formed in at least one of the glass layers, and wherein the at least one feature comprises a second feature configured as a differentiated area in a first portion of at least one of the glass layers, the differentiated area having at least one material property that is different compared to a remaining portion of the at least one glass layer.

* * * * *